US012615897B2

(12) United States Patent
Li et al.

(10) Patent No.: US 12,615,897 B2
(45) Date of Patent: Apr. 28, 2026

(54) METHOD AND APPARATUS FOR LED DISPLAY OPTICAL BLENDING

(71) Applicant: SCT LTD., Grand Cayman (KY)

(72) Inventors: Eric Li, Milpitas, CA (US);
Chang-Hung Pan, Milpitas, CA (US);
Shih-Feng Shao, Milpitas, CA (US);
Kuan-Hsiueng Wang, Milpitas, CA
(US); Yi-Ling Wen, Milpitas, CA (US);
Ching Lai, Milpitas, CA (US)

(73) Assignee: SCT LTD., Grand Cayman (KY)

( * ) Notice: Subject to any disclaimer, the term of this
patent is extended or adjusted under 35
U.S.C. 154(b) by 954 days.

(21) Appl. No.: 17/807,296

(22) Filed: Jun. 16, 2022

(65) Prior Publication Data

US 2022/0406976 A1     Dec. 22, 2022

Related U.S. Application Data

(60) Provisional application No. 63/211,196, filed on Jun.
16, 2021.

(51) Int. Cl.
| | |
|---|---|
| *H01L 33/58* | (2010.01) |
| *H01L 25/075* | (2006.01) |
| *H01L 33/00* | (2010.01) |
| *H10H 20/01* | (2025.01) |
| *H10H 20/855* | (2025.01) |

(52) U.S. Cl.
CPC ....... H10H 20/855 (2025.01); H01L 25/0753
(2013.01); H10H 20/01 (2025.01); *H10H
20/0363* (2025.01)

(58) Field of Classification Search
CPC .. H10H 20/855; H10H 20/01; H10H 20/0363;
H01L 25/0753
See application file for complete search history.

(56) References Cited

U.S. PATENT DOCUMENTS

| | | | | |
|---|---|---|---|---|
| 4,415,509 | A * | 11/1983 | Toyooka ............ | B29D 11/0073 |
| | | | | 264/172.19 |
| 2016/0260874 | A1* | 9/2016 | Reiss ..................... | H10H 20/01 |
| 2016/0293811 | A1* | 10/2016 | Hussell ............... | H10H 20/857 |
| 2018/0145057 | A1* | 5/2018 | Ulmer ................. | H10H 20/853 |
| 2018/0182940 | A1* | 6/2018 | Yamamoto ........... | F21V 7/0083 |
| 2019/0355884 | A1* | 11/2019 | Pan ..................... | H10H 20/853 |
| 2020/0091120 | A1* | 3/2020 | Higashisaka .......... | F21V 19/00 |
| 2020/0105184 | A1* | 4/2020 | Shao ................... | H10H 20/854 |

(Continued)

*Primary Examiner* — Tracie Y Green
(74) *Attorney, Agent, or Firm* — NKL Law; Allen Xue

(57) ABSTRACT

A method for assembling an LED display includes the steps
of: preparing a prefabricated diffuser film containing a light
diffusion agent; mounting a plurality of light emitting ele-
ments on a substrate, thereby forming a plurality of gaps
among the plurality of light emitting elements; filling the
plurality of gaps with a black resin to form a planar surface
composed of top surfaces of the plurality of light emitting
elements and top surfaces of the black resin in the plurality
of gaps; applying a transparent resin layer over the planar
surface; and affixing the prefabricated diffuser film on the
transparent resin layer. The resulting LED display has a
plurality of light emitting elements surrounded by a black
resin to form a checkered surface, a transparent resin layer
affixed to the checkered surface; and a diffuser film affixed
to the transparent resin layer by an adhesive.

7 Claims, 8 Drawing Sheets

(56)          References Cited

U.S. PATENT DOCUMENTS

| | | | |
|---|---|---|---|
| 2020/0193895 A1* | 6/2020 | Shao | G09G 3/32 |
| 2023/0207744 A1* | 6/2023 | Wang | H01L 21/0228 |
| | | | 257/99 |

* cited by examiner

METHOD AND APPARATUS FOR LED DISPLAY OPTICAL BLENDING

CROSS-REFERENCE TO RELATED APPLICATIONS

This application claims the benefit of priority under 35 U.S.C. § 119 to U.S. Provisional Application No. 63/211, 196, filed on Jun. 16, 2021, the entire contents of which are incorporated herein by reference.

FIELD OF TECHNOLOGY

The present disclosure relates to the field of LED (Light Emitting Diode) display, LED packaging, and the enhancement of visual effects of LED display. Specifically, the disclosed methods and/or apparatus relate to optimizing visual effects of LED displays, including adjusting the brightness of LED display to a desirable degree, reducing color shift of LED display, and/or reducing glossiness the surface of LED display. The disclosure also provides a composite film that can be applied to the surface of LED display to achieve above mentioned visual effects.

BACKGROUND

As new generations of LED displays have higher and higher resolutions, the number of LEDs per pitch increases. However, a high resolution LED display often appears too intense. Further, color variation in the LED display is a persistent issue, which becomes more pronounced when the viewing angle increases. Also, a glossy LED display panel reflects incident lights, which introduces another visual defect. To mitigate color shift, a molding layer having a light diffusion agent mixed therein can be applied to the surface of the LED display panel to form a diffuser layer. Adding the light diffusion agent into the molding layer over the LED display panel, however, creates its own issues, one of which is that the densities of the light diffusion agent in molding layers for different LED display panels are often slightly different. When the density of the light diffusion agent in the molding layer is low, the LED display panel appears to be darker, while a molding layer having a high density of the light diffusion agent makes the LED panel appear brighter. When multiple LED display panels having lightly different molding layers are assembled together to form a display wall, the unevenness in brightness and color shift amongst LED display panels become a significant problem. Therefore, there is a need to reduce the variation in brightness and color shift in LED display panels.

SUMMERY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one of the embodiments in this disclosure, a method for assembling an LED display includes the steps of: preparing a prefabricated diffuser film containing a light diffusion agent; mounting a plurality of light emitting elements on a substrate, thereby forming a plurality of gaps among the plurality of light emitting elements; filling the plurality of gaps with a black resin to form a planar surface composed of top surfaces of the plurality of light emitting elements and top surfaces of the black resin in the plurality of gaps; applying a transparent resin layer over the planar surface; and affixing the prefabricated diffuser film on the transparent resin layer.

Further, an LED display of the current disclosure includes a plurality of light emitting elements mounted on a substrate and gaps among the plurality of the light emitting elements are filled with a black resin to a height no higher than a top surface of each of the light emitting element to form a planar surface; a transparent resin layer affixed to the planar surface; and a diffuser film affixed to the transparent resin layer by an adhesive.

In certain embodiments, the black resin is filled in the plurality of gaps to a height no higher than the top surface of each of the plurality of light emitting elements so that the top surface, i.e., the surface facing a viewer and the light from the LED passes through, is not blocked by the black resin.

In some embodiments, the top surface of each of the plurality of light emitting elements is covered with a masking tape prior to the filling step to prevent them being stained by the black resin.

In other embodiments, the prefabricated diffuser film has a thickness of 10 µm to 300 µm and/or contains 0.1-20 wt % of the light diffusion agent.

In still other embodiments, each of the plurality light emitting elements is an LED chip or a surface mounted LED package.

In still further embodiments, the prefabricated diffuser film is roughened to form an uneven surface to reduce its glossiness.

In additional embodiments, spacers made of resin columns are disposed on top surfaces of the plurality of light emitting elements using a process involving applying a masking tape.

Other features and aspects will be apparent from the following detailed description, the drawings, and the claims.

BRIEF DESCRIPTION OF DRAWINGS

The teachings of the present invention can be readily understood by considering the following detailed description in conjunction with the accompanying drawings.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses, and/or methods described herein will be apparent to one of ordinary skill in the art.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, a light emitting diode (LED) display apparatus configured to reduce color shift over viewing angle variations and sharp bright LED lights and a method for fabricating the same according to an embodiment of the present disclosure will be explained in more detail with reference to the drawings attached.

Figure 1A:
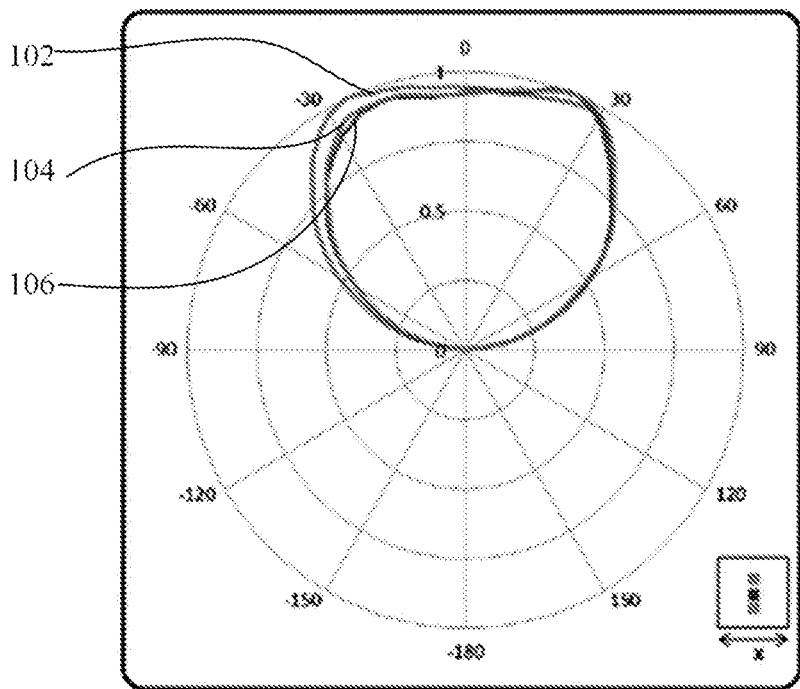
FIGS. 1A and 1B show typical LED color radiation patterns in the horizontal direction and in the vertical direction, respectively.
Figure 1B:
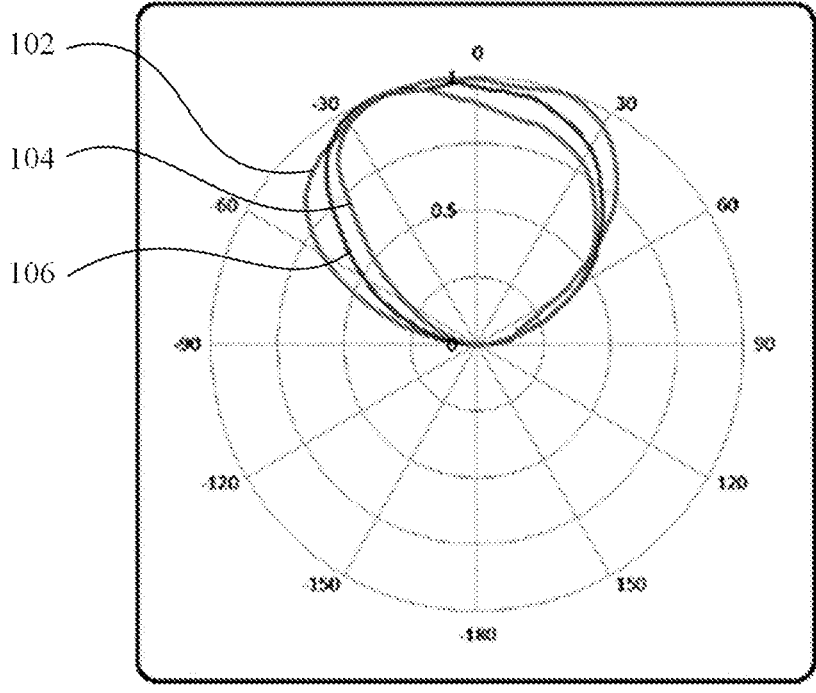

FIG. 1A shows an exemplary radiation pattern in the horizontal direction for red, blue, and green lights emitted from RBG LEDs, while FIG. 1B shows the radiation pattern in the vertical direction. As can be readily appreciated, the radiation patterns in the horizonal direction from the red LED (102), the green LED (104), and the blue LED (106) are more tightly overlapped while the radiation pattern in the vertical direction are more dispersed. As brightness calibration can only achieve a uniform brightness at a certain viewing angle, the LED display panel renders slightly different colors at different viewing angles (i.e., color shift), which is a common visual defect.

Light diffusers are applied to achieve uniformity in brightness and color in an illuminating apparatus such as an LED display and for directionally redistributing of incident light so that images on the LED display may be viewed from different viewing angles. There are two aspects of applying optical diffusers in display devices.

Figure 2:
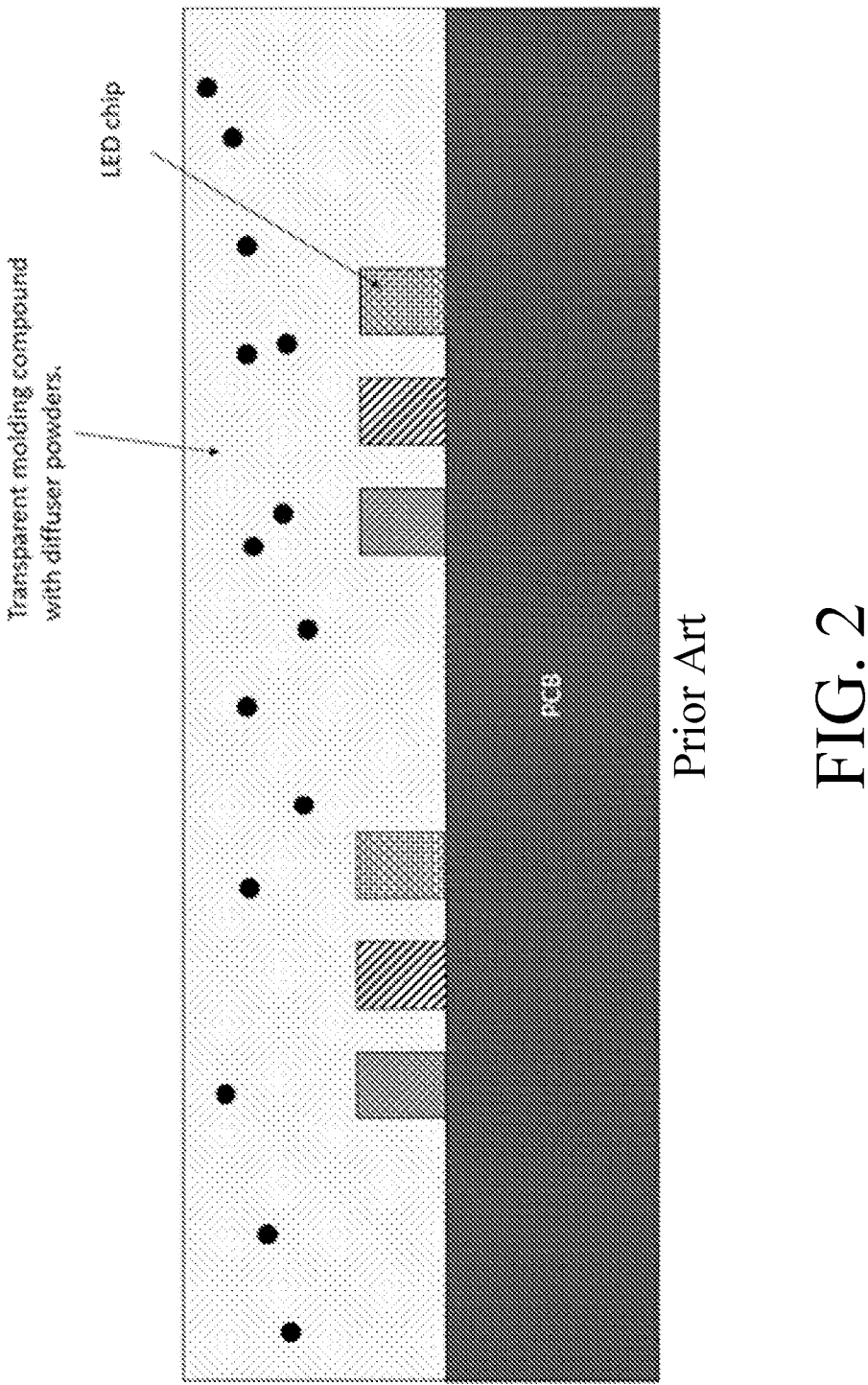
FIG. 2 schematically shows a prior art Chip-on-Board ("COB") LED display panel, in which the light diffusion agent is dispersed in the molding layer covering LED chips.
Figure 3:
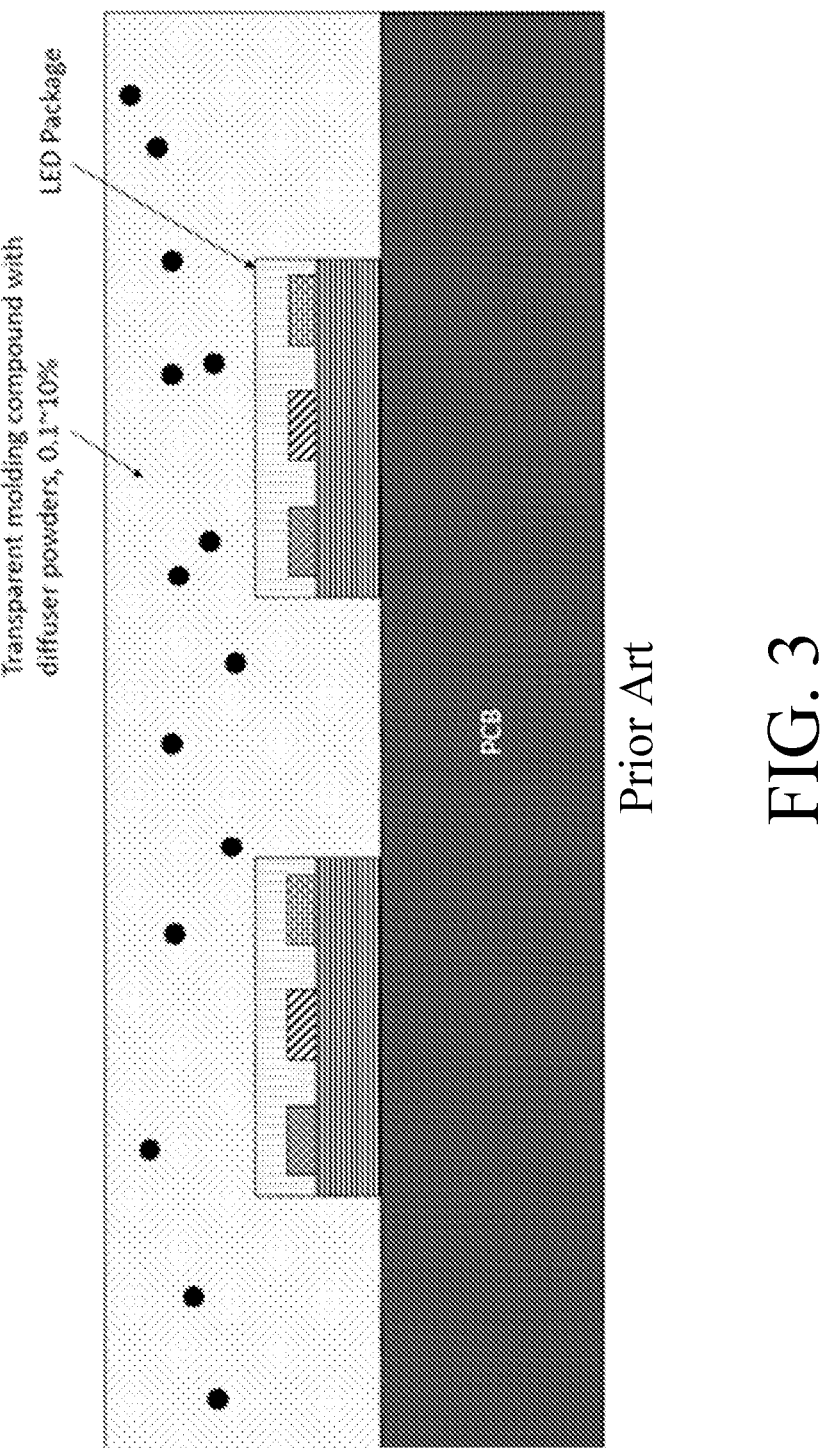
FIG. 3 schematically shows a prior art LED display panel having surface mounted LED packages, in which the light diffusion agent is dispersed in the molding layer covering LED packages.

FIGS. 2 and 3 illustrate two prior art applications of light diffusers in an LED display panel. In both cases, a molding layer (often made of a resin) contains a light diffusion agent, often in the form of powder particles, dispersed in it serves as the diffuser. In FIG. 2, the molding layer is applied over the LED chips mounted on a PCB board. In FIG. 3, the molding layer is applied over the LED packages mounted on a PCB board. However, due to variations in the amount and/or distribution of light diffusion agent in the molding layers as well as the warpage variations of different PCB boards, the resulting LED display panels may have slight differences sufficient to cause variations in brightness and/or color.

EMBODIMENTS

In certain embodiments of this disclosure, a pre-prepared diffuser film is applied, directly or indirectly, on the top surface of LED chips/packages in a LED display panel to reduce variations in the brightness and color shift, which overcomes the shortcomings of the traditional approach of applying a molding layer over the LED chips/packages.

Figures 4, 5:
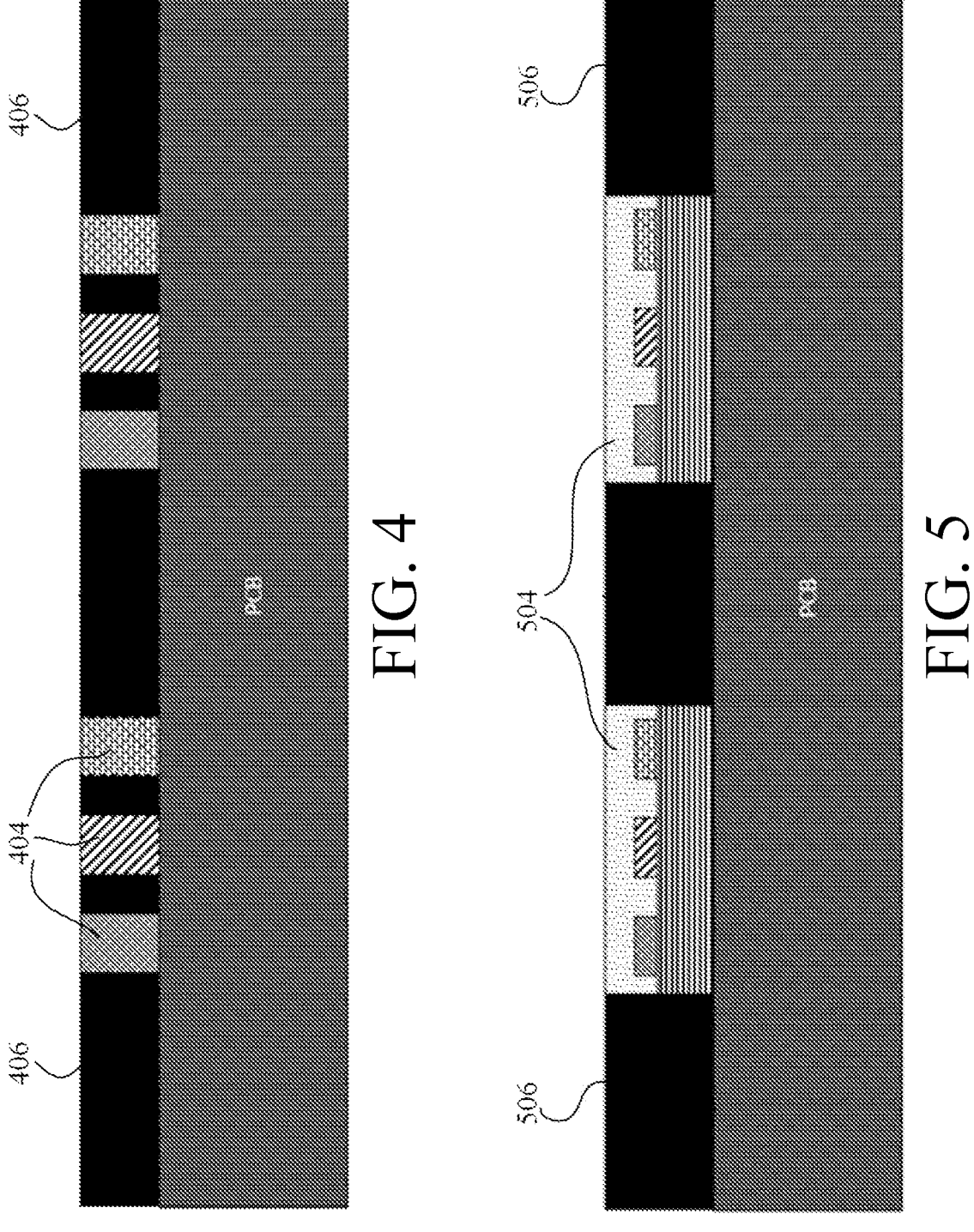
FIG. 4 schematically shows an LED display panel in which black resin fills the gaps among LED chips.
FIG. 5 schematically shows an LED display panel in which black resin fills the gaps among LED packages.

In one embodiment of the current disclosure, gaps among LED chips/packages on the PCB board are filled with a black resin while the top surface of the LEDs (i.e., the light emitting surface) remain uncovered. FIG. 4 shows a black resin (406) is filled, using known method and device(s), in the space/gaps among LED chips (404), which are mounted on the PCB board (402), while the top of the LED chips (404) is clear of the black resin. Likewise, FIG. 5 shows black resin (506) filled in the space/gaps among LED packages (504) mounted on the PCB board (502) and no black resin covers the light emitting surface of the LED packages (504). In this embodiment, the LED package can be a SMD type package with RGB LEDs encapsulated inside.

The black resin is a resin containing light-absorbing particles, e.g., graphite particles. In some embodiments, the black resin may contain different amounts of light-absorbing particles, exhibiting different degree of darkness. In other embodiments, the black resin may have filler particles that are not light-absorbing, as dictated by the visual effect the resulting LED display panel aims to achieve. One of the approaches to prevent the black resin from blocking the light emitting surface of the LED chips/packages is to use a masking tape having cut-outs, leaving slits matching the gaps amongst the LED chips/packages so that the black resin can be injected through slits in the masking tape without staining the LED chips/packages. After curing, the masking tape is lifted, exposing a substantially planar surface having a checkered pattern with black resin filled gaps/spaces (parts 612 in FIG. 6 or 712 in FIG. 7) and exposed the top surface of LED chips/packages (610 in FIG. 6 or 710 in FIG. 7). Thereafter, a transparent resin layer (604 in FIG. 6 or 704 in FIG. 7) is applied on to the entire checkered surface. This transparent resin protects the checkered surface and covers any uneven spots on the checkered surface to provide a substantially flat surface for subsequent application of the diffuser film. Optionally, this transparent resin layer is not provided and the diffuser film is directly applied to the checkered surface.

Figure 6:
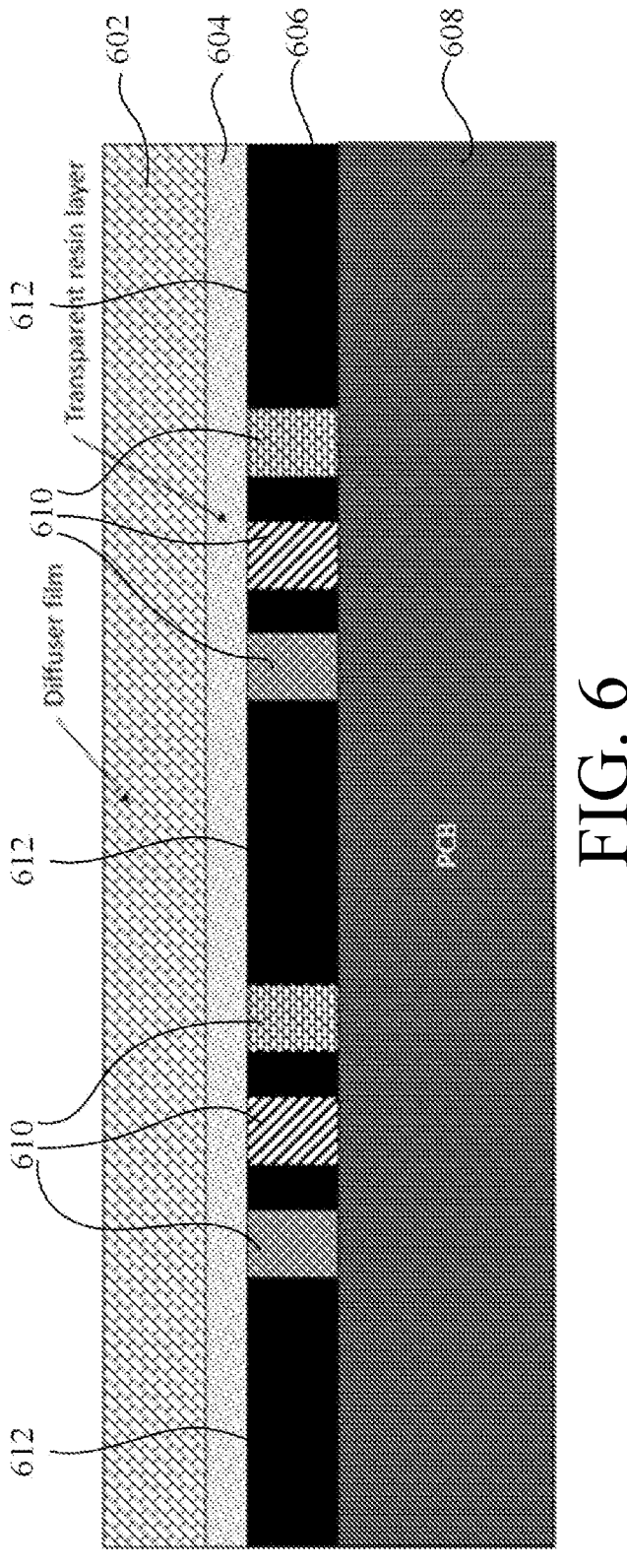
FIG. 6 schematically shows an LED panel structure having a diffuser film attached to a transparent resin layer that covers the top surface of LED chips.
Figure 7:
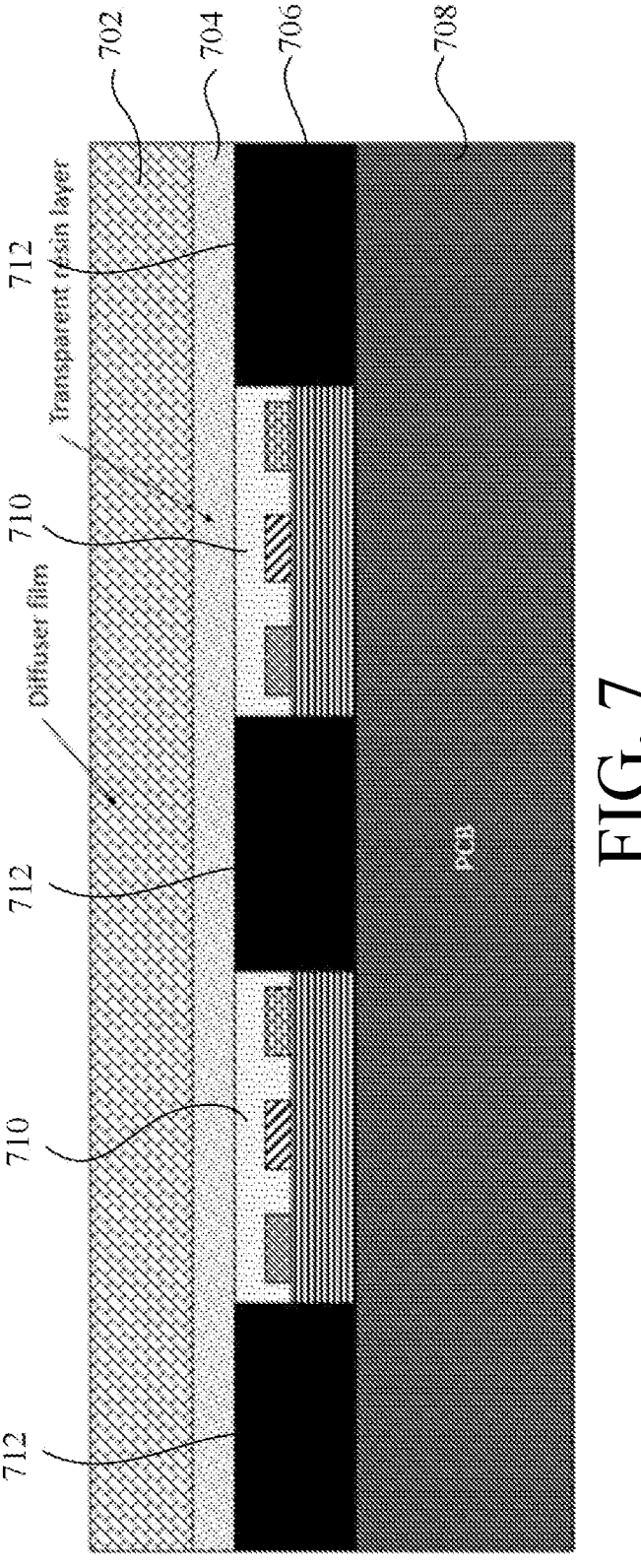
FIG. 7 schematically shows an LED panel structure having a diffuser film attached to a transparent resin layer that covers with the top surface of LED packages.

FIG. 6 shows a transparent resin layer (604) that covers and seals the top of the LED chips (610) and the black resin fillings (612). Similarly, FIG. 7 shows a transparent resin layer (704) covers and seals the checkered surface composed of the top of the LED packages (710) and the black resin fillings (706).

The diffuser film (602 or 702) is affixed to the transparent resin layer (604 or 704) by any known adhering means. Such adhering means can be an adhesive such as an OCA gel ("Optical Clear Adhesive" gel) or an epoxy resin applied between the transparent resin layer and the diffuser film. In some embodiments, the thickness of the transparent resin layer ranges from 10 μm to 100 μm (e.g., about 30 μm to 60 μm) while the thickness of the diffuser film ranges 10 μm to 300 μm (e.g., about from 30 μm to 100 μm). The weight percentage of light diffusion agent in the diffuser film is 0.1-20 wt %, e.g., 1-10 wt %, 1-4 wt %, or 7-10 wt %. The density of light diffusion agent in the diffuser film is proportional to the weight percentage of the light diffusion agent. As such, by adjusting the weight percentage of the light diffusion agent added to the diffuser film during its pre-fabrication process, one can adjust the density of the light diffusion agent in the diffuser film.

When the LED chips/packages have a high degree of unevenness, a diffuser film having a high light diffusion agent density can be employed to reduce the variations in its color and brightness. Conversely, when the LED chips/packages are highly uniform, the density of light diffusion agent can be adjusted to a lower value without risking color and brightness variations.

Differing from a molding layer containing light diffusion agent, the diffuser film is prefabricated using known methods and devices. The diffuser film is further cut (e.g., by laser) to match the checkered surface, in which cut-outs match space/gaps among the LED chips and packages and the remaining portion of the masking tape covering the top surface of LED chips/packages.

In making a diffuser film, all ingredients, i.e., the resin, the light diffusion agent, and other additives if needed, are thoroughly mixed so that the resulting diffuser film has identical or substantially the same light diffusion agent density as well as a uniform thickness across the whole diffuser film.

Diffuser films of different thickness have different visual effects, i.e., a thicker diffuser film appears darker and has a higher degree of diffusion effect than a thinner diffuser film does. In some embodiments, for a diffuser film of 100 μm in thickness, the thickness variation should be within ±5 μm, e.g., at ±1 μm. For comparison, a typical molding layer may have a thickness variation of ±15 μm to ±20 μm.

The light diffusion agent can be any commercially available ones. For example, silicone elastomer particles are a commonly used light diffusion agent. Silica particles may also be used. The diameter of such particles can be in the range of 1 μm to 5 μm, e.g., 1 μm to 3 μm.

The diffuser film can be applied, with any known methods and device(s) known in the field, on the transparent resin layer to achieve the illumination uniformity. Since the manufacturing of the diffuser film is independent of the underline LED chips/packages, it is streamlined, cost-effective, and capable to achieve predictable and reliable effect of illumination uniformity. Using a prefabricated diffuser film instead of a molding diffuser layer allows precise control of the size and density of the light diffusion agent as well its thickness to achieve an optimal diffusing effect in terms of mixing lights from different viewing angles.

Figure 9:
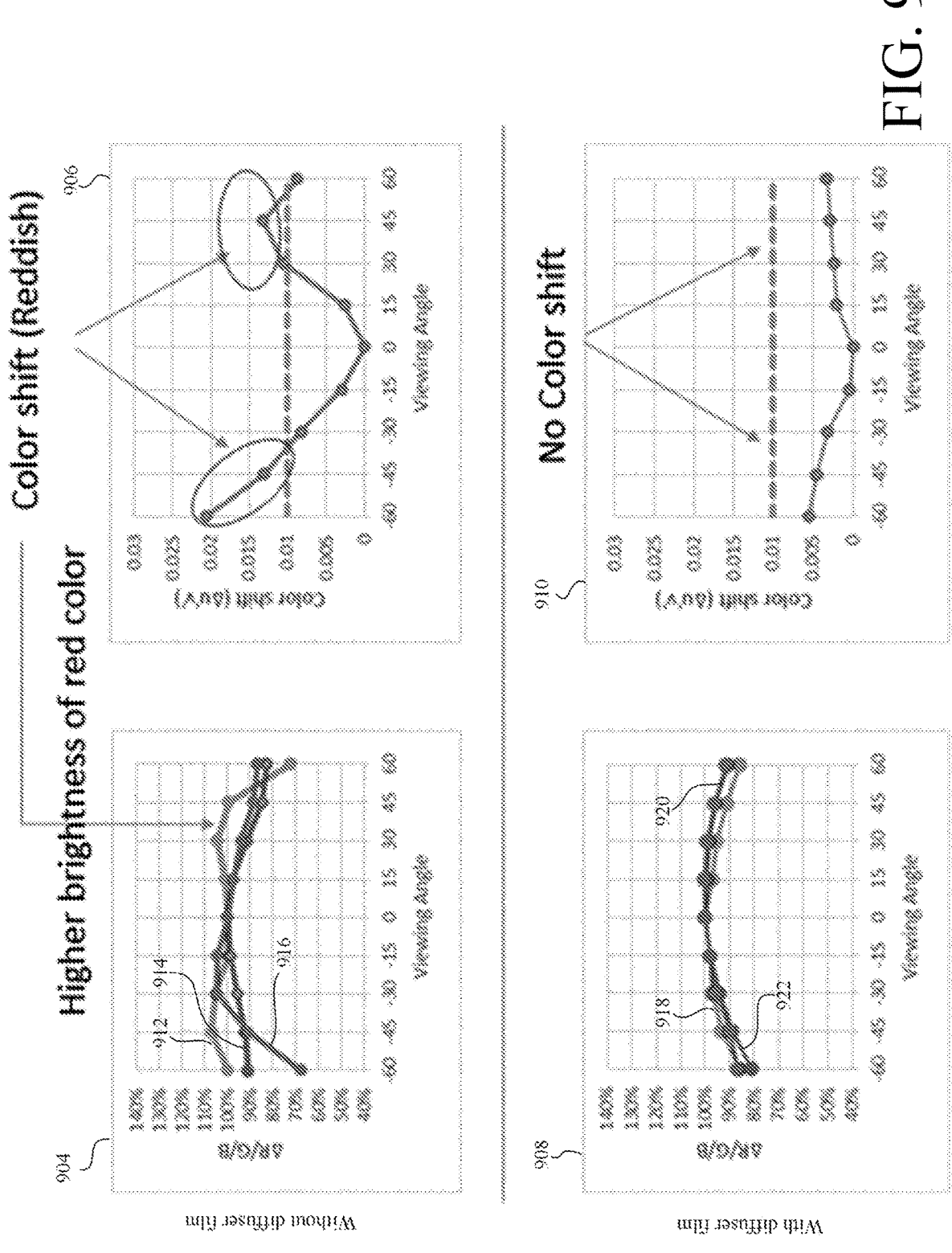
FIG. 9 shows charts comparing visual effects of an LED panel having a diffuser film of the current disclosure with an LED panel without a diffuser film.

As the light patterns of LED chips/packages from different vendors are known, the diffuser film can be tailor-made to compensate for variations in LED chips/packages from different vendors or different production batches, e.g., by calibrating the concentration of the light diffusion agent and the thickness of the diffuser film to optimize the visual effect. Accordingly, by applying different diffuser films on different LED chips/packages from different vendors, the color shift of the resulting LED display panel can be reduced. Consequently, the viewing angle of the LED display panel is expanded without a significant color shift. For example, without applying the diffuser film, an LED display panel has a viewing angle as small as 15° before significant color shift sets in, whereas after applying the diffuser films, the LED display panel has a viewing angle larger than 45°. Referring to FIG. 9, the upper left chart 904 shows, without a diffuser film, the brightness of red color (912), green color (914), and blue color (916) diverge when the viewing angle is larger than 15° or smaller than −15°. Likewise, the upper right chart 906 shows, without applying a diffuser film, there is a discernable color shift to red (i.e., the red color dominates the other two colors) when the viewing angle is larger than 30° or smaller than −30°. The lower left chart 908, on the other hand, shows that, with a diffuser film, the brightness of red color (918), green color (920), and blue color (922) vary little across viewing angles in the range of −60° to +60°. Correspondingly, the lower right chart (910) shows, with the diffuser film, there is no discernable color shift within viewing angles in the range of −60° to +60° since $A_{U'V'}$ is less than 0.01. Since a diffuser film is planar in shape, its diffusion effect manifests in all directions, meaning $\Delta U'$ and $\Delta V'$ are all reduced.

Figure 8:
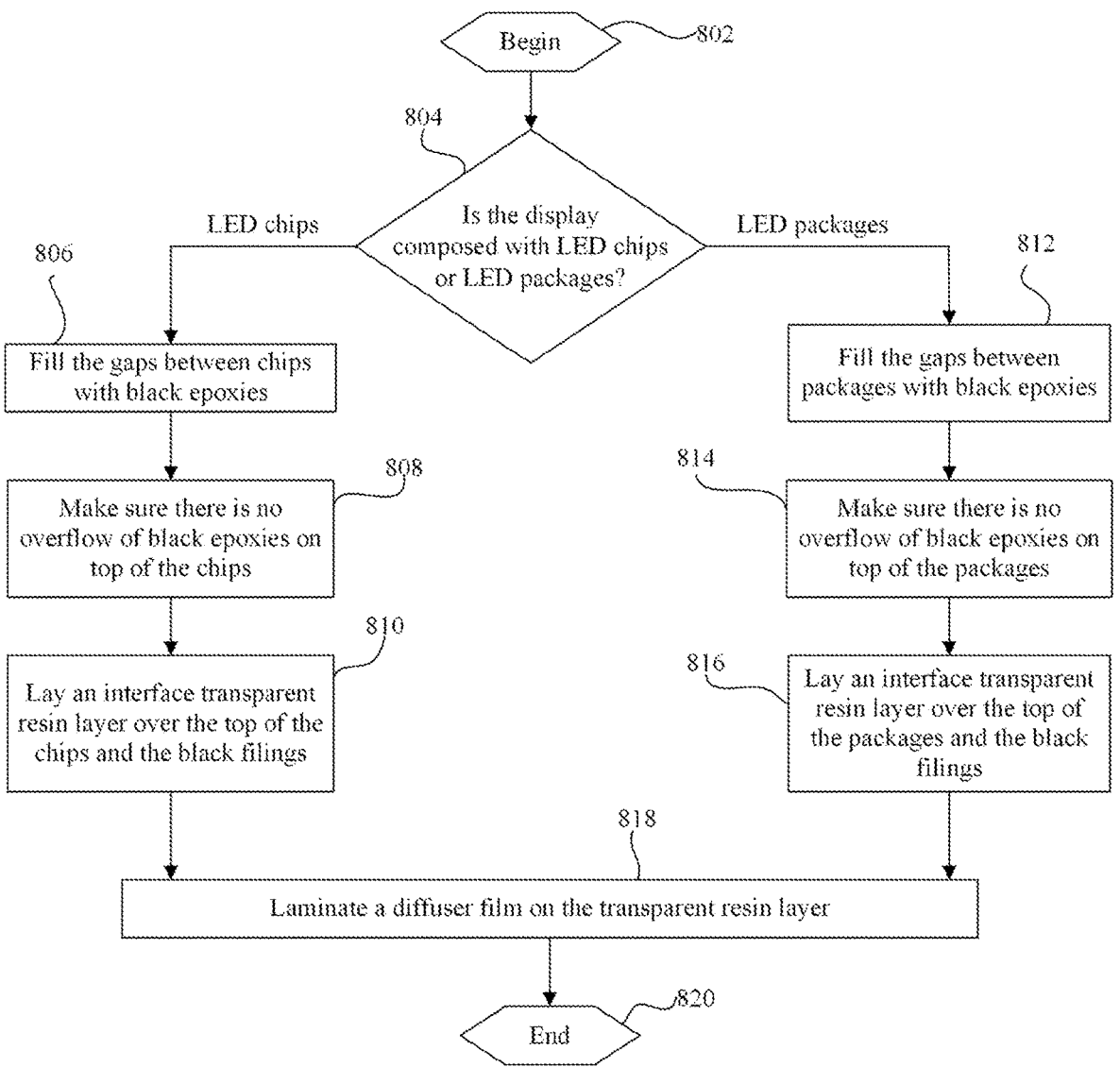
FIG. 8 schematically shows a process flow for preparing an LED display panel of the current disclosure.

FIG. 8 schematically shows an exemplary process for making an inventive LED display panel. The process starts with step 802 followed by step 804 wherein a determination of whether the display is composed with LED chips or with LED packages is made. The determination can be made by either by an automatic means such as a computerized device reading a barcode associated with the display to find out whether the display is a composed with chips or packages by searching a pre-configured display database containing an association of display barcodes and display's composition, or by a manual way (meaning, a human operator can visually tell whether a display contains chips or packages). If the display contains an array of LED chips, then the process proceeds to step 806. Otherwise, the process proceeds to step 812. Both of steps 806 and 812 can be fulfilled by using known method or tools.

In the case of LED chips, the filling step 806 involves filling the gaps/spaces among LED chips with a black resin, and then proceeds to step 808 wherein necessary measures are taken to make sure the black resin does not cover the top surface of the LED chips, e.g., using a masking process. The process proceeds to step 810, in which a transparent resin layer is laid over the top surface of the LED chips and the black resin fillings.

In the case of LED packages, the filling step 812 involves filling the gaps among packages with the black resin, and then proceeds to step 814 wherein necessary measures (such as applying a mask tape) are taken to make sure that the black resin does not stain the top of the LED packages. The process proceeds to step 816 wherein a transparent resin layer is laid over the top of the packages and the black fillings.

In steps 810 and 816, a prefabricated diffuser film is laminated, by using a method and tool known in the field, on the transparent resin layer, and lastly the process concludes on step 820. A diffusor film has an additional benefit of masking imperfections on a surface it covers. For example, bubbles in the transparent resin layer, the by-product of the molding process, are less visible after applying the diffuser film.

A diffusor film has an additional benefit of masking imperfections on a surface it covers. For example, bubbles in the transparent resin layer, the by-product of the molding process, are less visible after applying the diffuser film.

In some embodiments of the disclosure, the black powder is optionally added to the diffuser films to reduce the darkness of the LED display panel. For example, adding 0.3% mass percentage of black powder to the diffuser film (i.e., 0.3% of the total mass of the film is the black powder) may result in a 10% reduction of the brightness of the LED display panel. The black powder is carbon/graphite powder in the size of nano scale (e.g., about 100 Angstrom in size).

In some embodiments of the disclosure, the top surface of the diffusor film can be roughened to reduce its glossiness. A viewer may see a reflection of image from a glossy LED display panel, which may not be desirable. By adjusting the roughness of the diffusor film, one can adjust the glossiness of the LED display panel as needed.

In some further embodiments, a spacer can be placed between the top of the LED chips/packages and the diffuser film. The spacer may be created using another masking process after the gaps among the LED chips/packages are filled with the black resin. For example, holes match the size and the location of the top surface of the LED chip/packages can be punched into a masking tape, e.g., using laser beams. The punched hole can be filled with a layer of resin. After the resin is solidified, the masking tape is lifted, leaving resin columns on top of the LED chips/packages, which function as spacers between the LED surface and the bottom of the diffusor film. The height of the resin columns can be controlled in the manufacturing process by, e.g., the thickness of the masking tape, so that the thickness of the spacer can be precisely controlled.

Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

The invention claimed is:

1. An LED display panel, comprising:
   a plurality of light emitting elements mounted on a substrate, wherein gaps among the plurality of light emitting elements are filled with a black resin, wherein a top surface of the black resin is no higher than a top surface of each light emitting element, forming a planar surface that comprises the top surface of each light emitting element and the top surface of the black resin;
   a transparent resin layer affixed to and covering an entirety of the planar surface; and
   a diffuser film affixed to and covering the transparent resin layer by an adhesive.

2. The LED display panel of claim 1, wherein the diffuser film is prefabricated and contains a light diffusion agent.

3. The LED display panel of claim 2, wherein the pre-fabricated diffuser film has a thickness of 10 $\mu$m to 300 $\mu$m.

4. The LED display panel of claim 2, wherein the pre-fabricated diffuser film contains 0.1-10 wt % of the light diffusion agent.

5. The LED display panel of claim 1, wherein each of the plurality of light emitting elements is an LED chip.

6. The LED display panel of claim 2, wherein the pre-fabricated diffuser film has a surface that is roughened to reduce glossiness.

7. The LED display panel of claim 2, wherein each of the plurality of light emitting elements is a surface mount LED package.

* * * * *